US012063719B2

(12) United States Patent
Suzuki

(10) Patent No.: US 12,063,719 B2
(45) Date of Patent: Aug. 13, 2024

(54) HEATING DEVICE

(71) Applicant: NGK SPARK PLUG CO., LTD., Nagoya (JP)

(72) Inventor: Keisuke Suzuki, Nagoya (JP)

(73) Assignee: NITERRA CO., LTD., Nagoya (JP)

( * ) Notice: Subject to any disclaimer, the term of this patent is extended or adjusted under 35 U.S.C. 154(b) by 961 days.

(21) Appl. No.: 17/081,218

(22) Filed: Oct. 27, 2020

(65) Prior Publication Data
US 2021/0136875 A1  May 6, 2021

(30) Foreign Application Priority Data

Nov. 5, 2019  (JP) ................................. 2019-200564

(51) Int. Cl.
| | |
|---|---|
| H02N 13/00 | (2006.01) |
| H05B 3/03 | (2006.01) |
| H05B 3/10 | (2006.01) |
| H05B 3/26 | (2006.01) |
| H05B 3/74 | (2006.01) |
| H01L 21/67 | (2006.01) |

(52) U.S. Cl.
CPC ............... *H05B 3/03* (2013.01); *H02N 13/00* (2013.01); *H05B 3/10* (2013.01); *H05B 3/265* (2013.01); *H05B 3/748* (2013.01); *H01L 21/67103* (2013.01); *H05B 2203/002* (2013.01)

(58) Field of Classification Search
None
See application file for complete search history.

(56) References Cited

U.S. PATENT DOCUMENTS

| | | | |
|---|---|---|---|
| 2006/0221539 A1 | 10/2006 | Morita | |
| 2023/0317493 A1* | 10/2023 | Ono | H01L 21/6833 361/234 |
| 2024/0064869 A1* | 2/2024 | Yoo | H05B 3/265 |

FOREIGN PATENT DOCUMENTS

| | | |
|---|---|---|
| JP | 2006-310832 A | 11/2006 |
| JP | 2007-142441 A | 6/2007 |
| JP | 2011-049425 A | 3/2011 |
| JP | 3182120 U | 3/2013 |

(Continued)

OTHER PUBLICATIONS

Jp2017152537, Suzuki et al, Biblio data sheet for JP6510440B2, (Year: 2017).*

(Continued)

*Primary Examiner* — Joseph M. Pelham
(74) *Attorney, Agent, or Firm* — Stites & Harbison, PLLC; Jeffrey A. Haeberlin

(57) ABSTRACT

A heating device includes a heater electrode disposed in the inner portion of a plate-like body and including a heater line portion; and a plurality of specific portions arranged side by side in a predetermined arrangement direction. The heater line portion includes a first heater line portion and a second heater line portion arranged in a location closer than the first heater line portion to the specific portions. The second heater line portion has a projecting line part passing through a first virtual straight line and curving toward a side of the first heater line portion; and a recessed line part extending to avoid a second virtual straight line and curving toward a side opposite to the side of the first heater line portion.

8 Claims, 6 Drawing Sheets

(56) References Cited

FOREIGN PATENT DOCUMENTS

JP            2016115933 A  *   6/2016  ............... B23Q 3/15
JP             6510440 B2  *   5/2019

OTHER PUBLICATIONS

Korean Intellectual Property Office, Notice of Filing of a Third Party Observation and Reasons for Submission, issued in corresponding Application No. KR 10-2020-0142156, issued Aug. 1, 2022.
Taiwan Intellectual Property Office, Notification of a Third Party Opinion and Reasons for Submission issued in corresponding Application No. TW 109138376, mailed Jun. 23, 2022.
Taiwan Intellectual Property Office, Office Action issued in corresponding Application No. 109138376, dated Aug. 5, 2022 (Translation not available.).
Japan Patent Office, Notification (Notice of Submission of Publications) issued in corresponding Application No. JP 2019-200564 dated Sep. 9, 2022.
The State Intellectual Property Office of People's Republic of China, The Second Office Action issued in corresponding Application No. 202011208955.8 dated Mar. 7, 2024.

\* cited by examiner

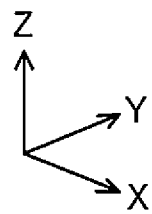
FIG.1
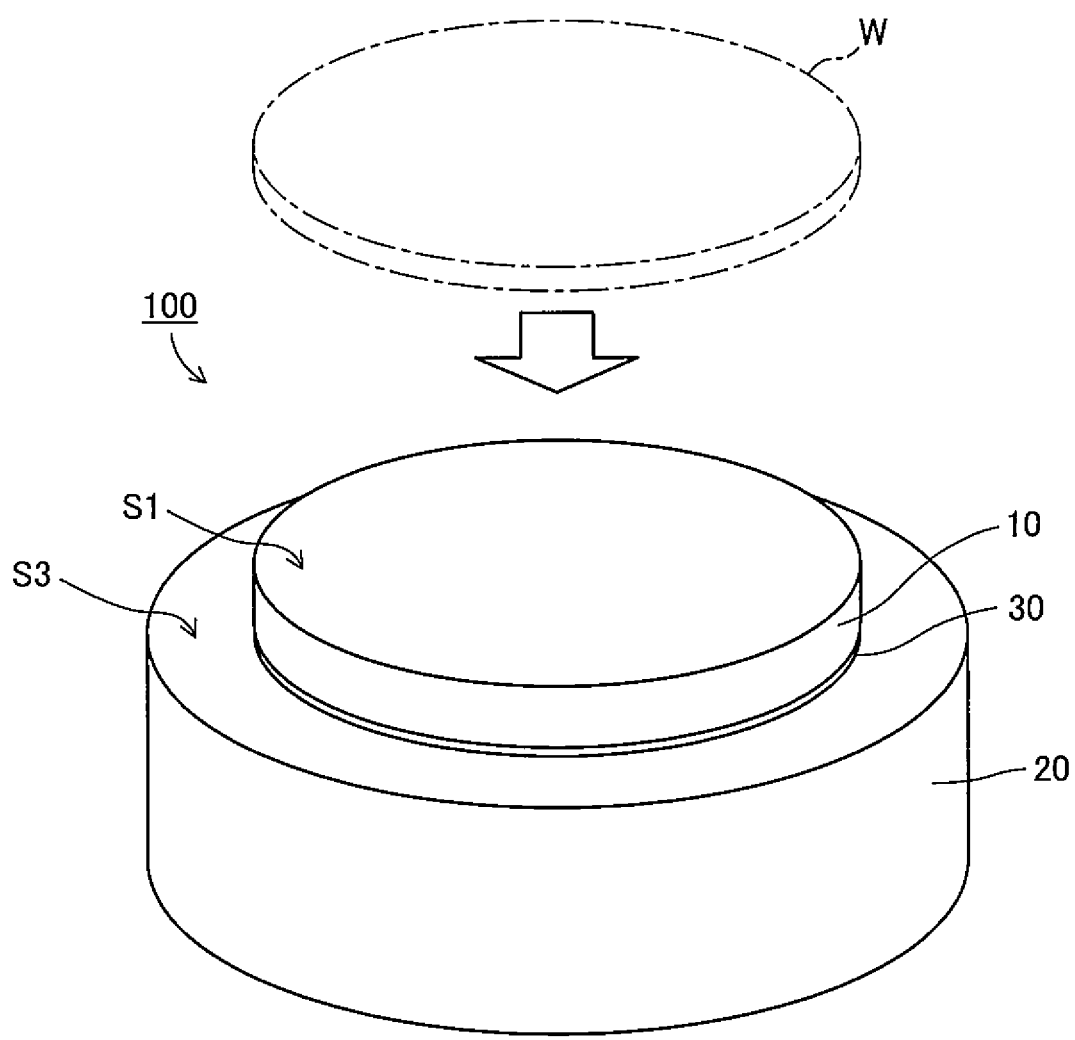

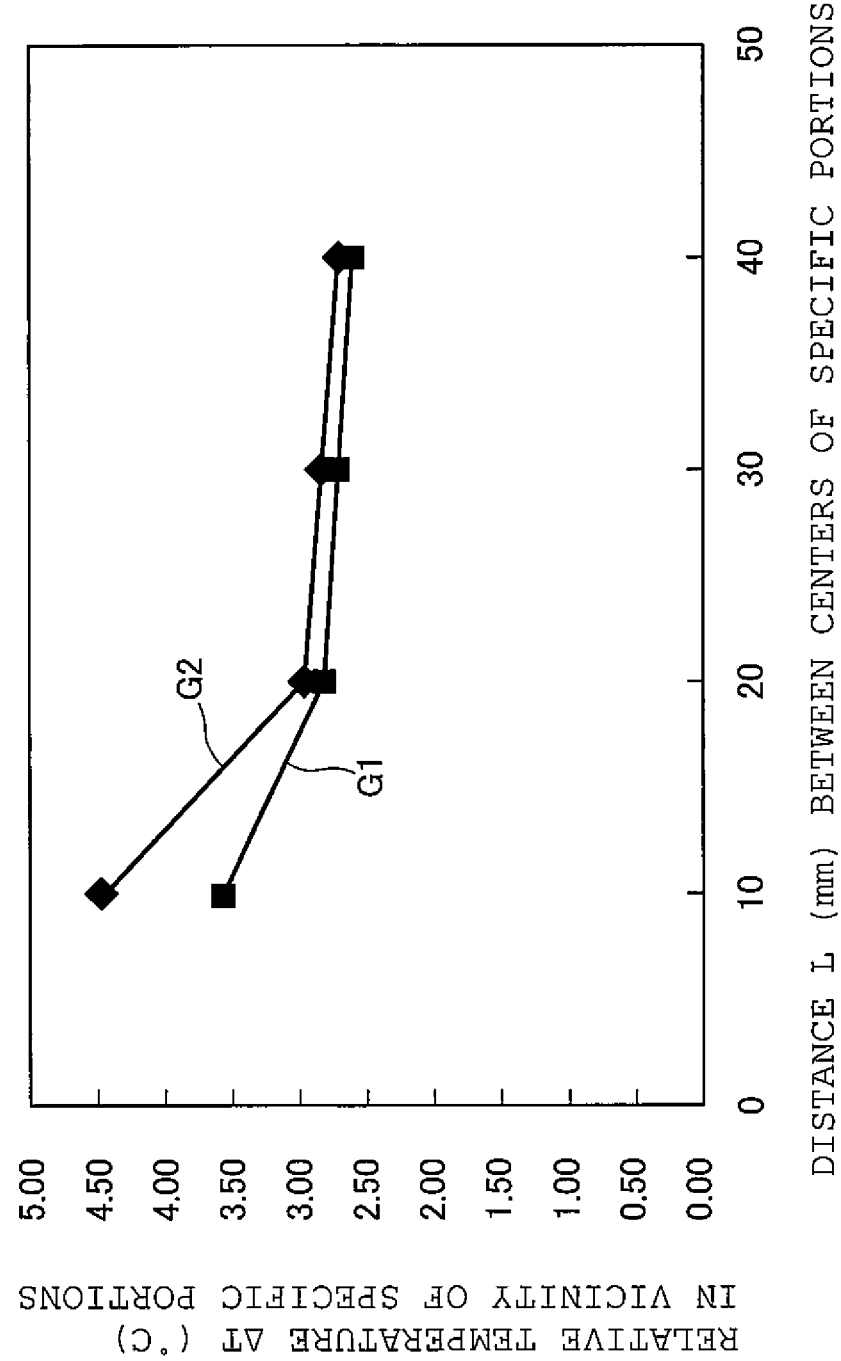

HEATING DEVICE

CROSS REFERENCE TO RELATED APPLICATION

The present application claims priority under to Japanese Patent Application No. 2019-200564 filed on Nov. 5, 2019, which is incorporated herein by reference.

TECHNICAL FIELD

The technology disclosed in the present specification relates to a heating device including a heater electrode.

BACKGROUND ART

An electrostatic chuck is used, for example, as a device on which a wafer is to be disposed to manufacture a semiconductor. The electrostatic chuck includes a ceramic member having a substantially planar surface (hereinafter referred to as the "attraction surface") substantially perpendicular to a predetermined direction (hereinafter referred to as the "first direction"), and a chuck electrode disposed in the inner portion of the ceramic member. The electrostatic chuck attracts and holds a wafer on the attraction surface of the ceramic member by utilizing an electrostatic attraction force that is generated by a voltage applied to the chuck electrode.

When the temperature of the wafer held on the attraction surface of the electrostatic chuck does not become a desired temperature, accuracy of each processing (deposition, etching, and the like) with respect to the wafer may be degraded. Thus, it is desirable for electrostatic chucks to have a capacity of controlling temperature distribution of a wafer. Therefore, for example, a heater electrode including a heater line portion that is a linear resistive heating element is provided in the inner portion of a ceramic member. When a voltage is applied to the heater electrode, the heater electrode generates heat to thereby heat the ceramic member, and consequently, temperature control of the attraction surface of the ceramic member (eventually, temperature control of the wafer held on the attraction surface) is achieved.

In the ceramic member of the electrostatic chuck, there is present a specific portion where the heater line portion of the heater electrode is not allowed to be disposed, for example, as with a through hole for a lift pin. Thus, for example, there is a known technology in which, in a configuration in which a heater electrode includes a plurality of heater line portions that are concentric as viewed in a first direction, some of the heater line portions are disposed to be curved to avoid a through hole for a lift pin (refer to, for example, PTL 1).

CITATION LIST

Patent Literature

PATENT LITERATURE 1: Japanese Registered Utility Model No. 3182120

SUMMARY OF INVENTION

Technical Problem

Not limited to a through hole for a lift pin, for example, a hole (for example, a gas flow channel) formed in a ceramic member, and a conductive portion (for example, a conductive pad or a via) disposed in the inner portion of a ceramic member can be the aforementioned specific portion in the ceramic member. Thus, it is assumed that the shape of one heater line portion located close to a plurality of specific portions as viewed in the first direction is made to be a shape having a plurality of curved parts to avoid each of the plurality of specific portions. In such a configuration, there is a high possibility of a high-temperature region being generated due to dense presence of a plurality of the heater line portions. However, such a situation has not been sufficiently examined.

Such a problem is not limited to an electrostatic chuck that holds a wafer by utilizing an electrostatic attraction force. This problem is common among general heating devices (parts for manufacturing a semiconductor) including a heater electrode.

The present specification discloses a technology capable of solving at least part of the above-described problem.

Solution to Problem

The technology disclosed in the present specification can be achieved as following aspects.

(1) A heating device disclosed in the present specification is a heating device including: a plate-like body having a first surface substantially perpendicular to a first direction; a heater electrode disposed in an inner portion of the plate-like body, the heater electrode including a heater line portion that is a resistive heating element that is linear as viewed in the first direction; and a plurality of specific portions disposed in the inner portion of the plate-like body and arranged side by side in a predetermined arrangement direction as viewed in the first direction, each of the plurality of specific portions being a hole or a conductive portion extending in the first direction. The heating device is configured to allow an object to be disposed on the first surface of the plate-like body. The heater line portion included in the heater electrode (i.e., the heater line portion of the heater electrode) as viewed in the first direction includes a first heater line portion extending in the arrangement direction, and a second heater line portion extending in the arrangement direction and disposed in a location closer than the first heater line portion to the plurality of specific portions. When a straight line that connects the center of a first specific portion among the plurality of specific portions and the first heater line portion to each other by a shortest distance is represented by a first virtual straight line, and a straight line that connects the center of a second specific portion adjacent to the first specific portion and the first heater line portion to each other by a shortest distance is represented by a second virtual straight line. In other words, a first virtual straight line segment is defined by a straight line that connects by a shortest distance a center of a first specific portion among the plurality of specific portions and the first heater line portion, and a second virtual straight line segment is defined by a straight line that connects by a shortest distance a center of a second specific portion among the plurality of specific portions adjacent to the first specific portion and the first heater line portion. The second heater line portion as viewed in the first direction includes a projecting line part that passes through the first virtual straight line and that curves in a shape that projects toward (a side) of the first heater line portion, and a recessed line part that extends to avoid the second virtual straight line and that curves in a shape that is recessed toward a side opposite to the side of the first heater line portion (i.e., away from the first heater line portion).

In the heating device, the heater line portion of the heater electrode includes the first heater line portion and the second heater line portion, and the first heater line portion and the second heater line portion each extend substantially in the arrangement direction of the plurality of specific portions. The second heater line portion is disposed in a location closer than the first heater line portion to the plurality of specific portions and has the projecting line part and the recessed line part that curve in accordance with the first specific portion and the second specific portion. That is, the projecting line part as viewed in the first direction curves in a shape that projects toward the same side as the first heater line portion with respect to the first specific portion. In contrast, the recessed line part as viewed in the first direction curves in a shape that is recessed toward a side opposite to the side of the first heater line portion with respect to the second specific portion. Thus, compared with a configuration in which, for example, the heater line portion of the heater electrode curves in a shape that projects toward the same side with respect to both the first specific portion and the second specific portion that are adjacent to each other, it is possible to suppress a high-temperature region from being generated due to dense presence of the heater line portions around the plurality of specific portions as viewed in the first direction.

(2) In the aforementioned heating device, a distance between the center of the first specific portion and the center of the second specific portion may be 60 mm or less. According to the heating device, the specific portions are present densely, and it is thus effective, in particular, to employ the present invention.

(3) In the aforementioned heating device, the plurality of specific portions may include a third specific portion adjacent to the second specific portion on a side opposite to a side of the first specific portion, and, when a straight line that connects the third specific portion and the first heater line portion to each other by a shortest distance is represented by a third virtual straight line, the second heater line portion may further have a second projecting line part that passes through the third virtual straight line and that curves in a shape that projects toward (the side of) the first heater line portion. In other words, the plurality of specific portions include a third specific portion adjacent to the second specific portion opposite from the first specific portion, a third virtual straight line is defined by a straight line that connects by a shortest distance the third specific portion and the first heater line portion, and the second heater line portion further includes a second projecting line part that passes through the third virtual straight line and that curves in a shape that projects toward the first heater line portion. According to the heating device, compared with a configuration in which, for example, the heater line portion of the heater electrode curves in a shape that projects toward the same side with respect to all of three specific portions that are adjacent to each other, it is possible to suppress a high-temperature region from being generated due to dense presence of the heater line portions around the plurality of specific portions as viewed in the first direction.

(4) In the aforementioned heating device, the distance between the center of the first specific portion and the center of the second specific portion, and a distance between the center of the second specific portion and the center of the third specific portion may be each 60 mm or less. According to the heating device, the specific portions are present densely, and it is thus effective, in particular, to employ the present invention.

(5) In the aforementioned heating device, a shortest distance between the first heater line portion and the specific portion corresponding to the recessed line part (of the second heater line portion) may be shorter than a shortest distance between the first heater line portion and the specific portion corresponding to the projecting line part (of the second heater line portion). According to the heating device, regarding the first heater line portion, while suppressing an unnecessary shape change in the vicinity of the specific portion corresponding to the recessed line part, it is possible to suppress a high-temperature singular point from being generated due to dense presence of the heater line portions around the specific portion corresponding to the projecting line part.

(6) In the aforementioned heating device, the heater line portion included in the heater electrode may further include a third heater line portion extending in the arrangement direction and disposed on the side opposite to the side of the first heater line portion with respect to the second heater line portion as viewed in the first direction. In other words, the heater line portion of the heater electrode further includes a third heater line portion extending in the arrangement direction and, as viewed in the first direction, disposed opposite to the first heater line portion with respect to the second heater line portion. A shortest distance between the third heater line portion and the specific portion corresponding to the projecting line part (of the second heater line portion) may be shorter than a shortest distance between the third heater line portion and the specific portion corresponding to the recessed line part (of the second heater line portion). According to the heating device, regarding the third heater line portion, while suppressing an unnecessary shape change in the vicinity of the specific portion corresponding to the projecting line part, it is possible to suppress a high-temperature singular point from being generated due to dense presence of the heater line portions around the specific portion as viewed in the first direction.

(7) In the aforementioned heating device, the plate-like body may include a ceramic member having the first surface and a second surface opposite to the first surface, a base member having a third surface and arranged such that the third surface is located on a side of (i.e., faces) the second surface of the ceramic member, the base member being formed of a material having thermal conductivity higher than thermal conductivity of the ceramic member, and a joining portion that is disposed between the second surface of the ceramic member and the third surface of the base member and that joins the ceramic member and the base member to each other; and at least one of the plurality of specific portions may be a hole formed (i.e., defined) in the base member. According to the heating device, while suppressing a suction effect of the base member from varying due to holes formed in the base member, it is possible to suppress a high-temperature region from being generated due to dense presence of the heater line portions around the plurality of specific portions as viewed in the first direction.

Note that the technology disclosed in the present specification can be achieved in various aspects and can be achieved in the aspect of, for example, a holding device, an electrostatic chuck, a part for manufacturing a semiconductor, a heater device, such as a CVD heater, a vacuum chuck, other heating devices including a heater electrode, manufacturing methods thereof, and the like.

BRIEF DESCRIPTION OF DRAWINGS

FIG. 1 is a schematic perspective view of an appearance configuration of an electrostatic chuck 100 according to an embodiment.

FIG. 6 is an illustration of a relationship between a distance L between the centers of specific portions and a relative temperature $\Delta T$ (° C.) in the vicinity of the specific portions.

DESCRIPTION OF EMBODIMENTS

A. Embodiment

A-1. Configuration of Electrostatic Chuck 100

Figure 2:
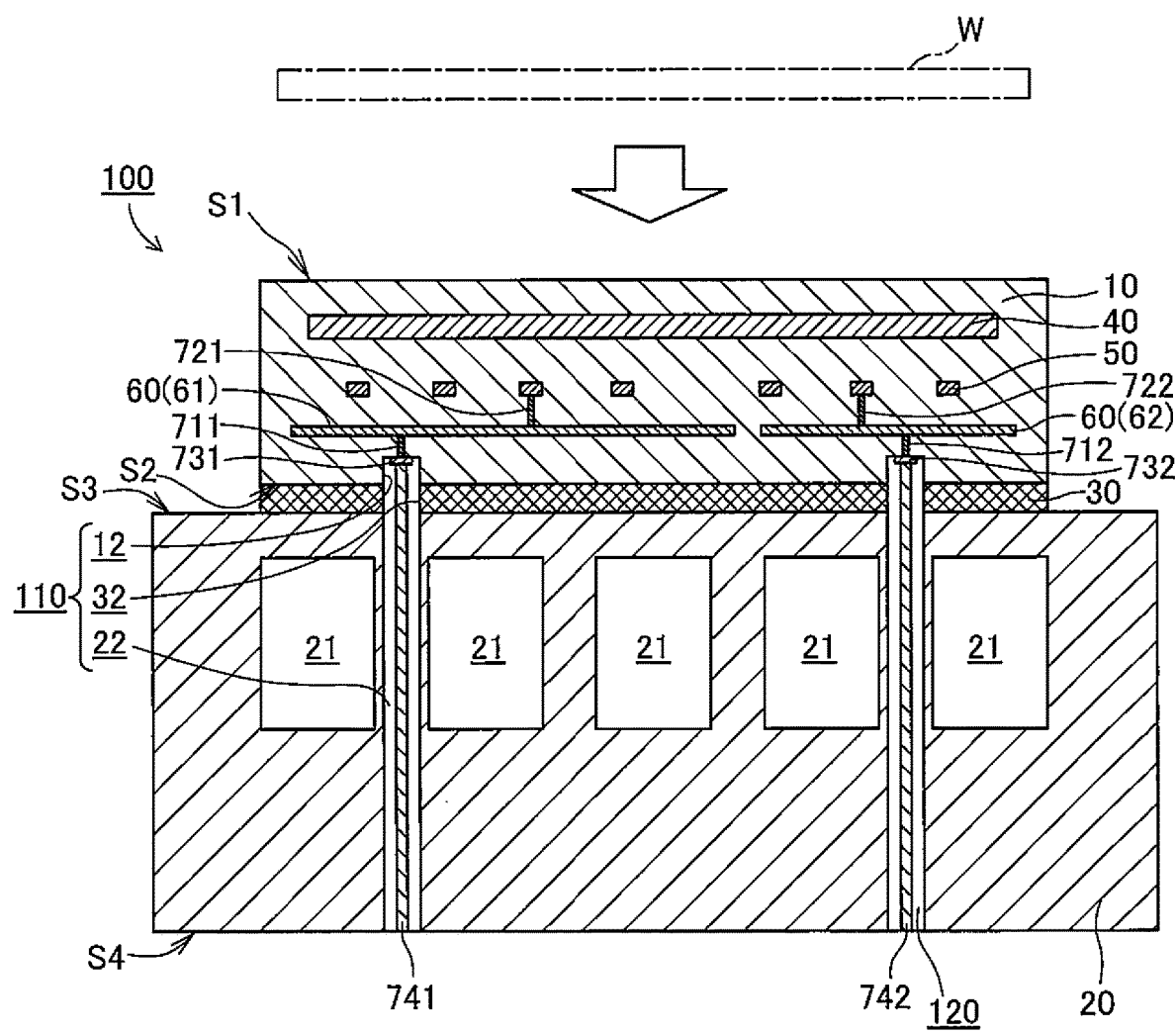
FIG. 2 is a schematic illustration of an XZ-section configuration of the electrostatic chuck 100 according to the embodiment.
Figure 3:
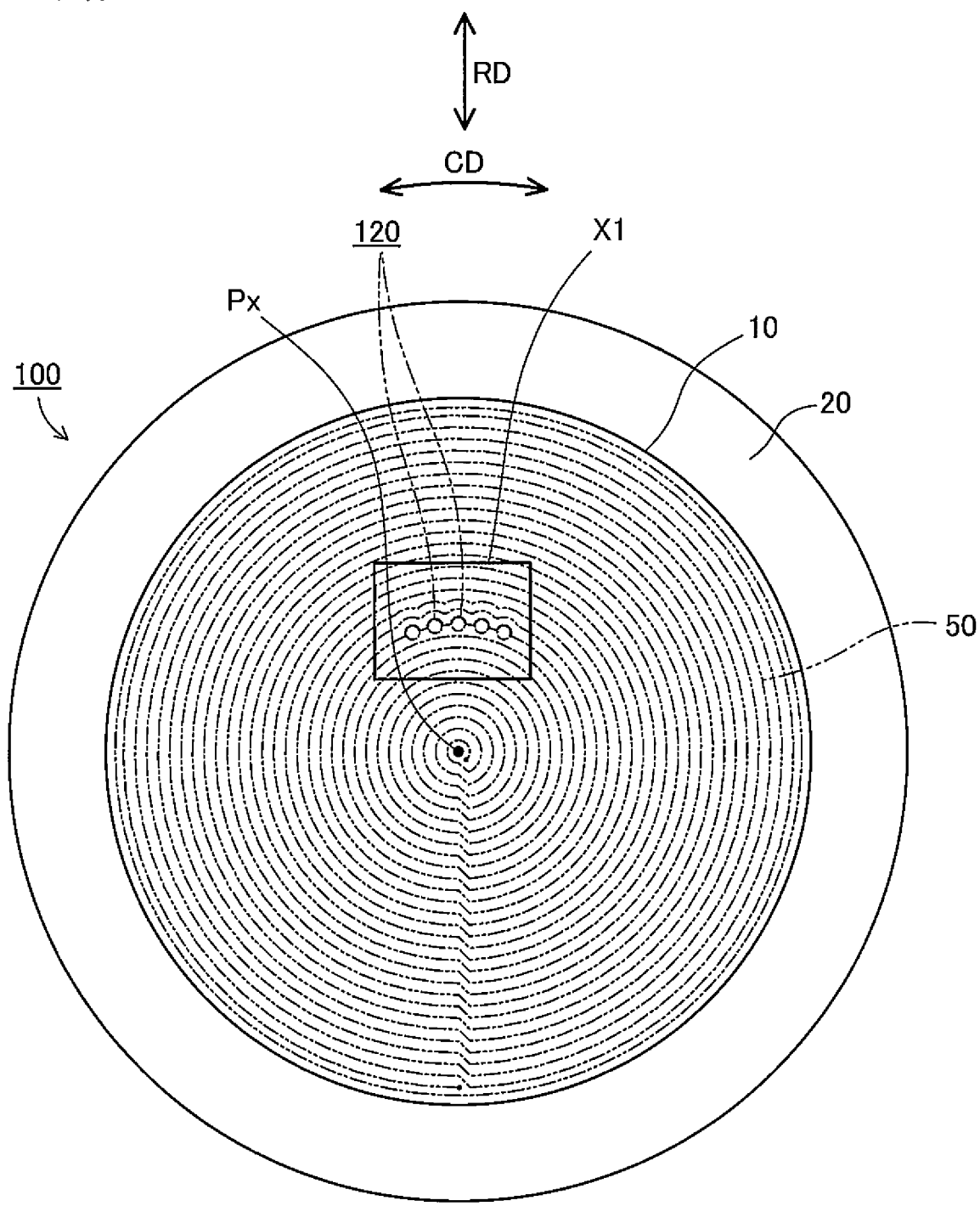
FIG. 3 is a schematic illustration of an XY-plane (top face) configuration of the electrostatic chuck 100 according to the embodiment.

FIG. 1 is a schematic perspective view of an appearance configuration of an electrostatic chuck 100 according to the present embodiment. FIG. 2 is a schematic illustration of an XZ-section configuration of the electrostatic chuck 100 according to the present embodiment. FIG. 3 is a schematic illustration of an XY-plane (top face) configuration of the electrostatic chuck 100 according to the present embodiment. Each figure illustrates mutually orthogonal XYZ axes for specifying directions. In the present specification, the Z-axis positive direction is referred to as an up direction, and the Z-axis negative direction is referred to as a down direction, for convenience. However, actually, the electrostatic chuck 100 may be installed in a direction that differs from such directions.

The electrostatic chuck 100 is a device that holds an object (for example, a wafer W) by attraction with an electrostatic attraction force and is used, for example, for fixing the wafer W in a vacuum chamber of a semiconductor manufacturing apparatus. The electrostatic chuck 100 includes a ceramic member 10 and a base member 20 that are disposed side by side in a predetermined arrangement direction (up-down direction (Z-axis direction) in the present embodiment). The ceramic member 10 and the base member 20 are disposed such that a lower surface S2 (refer to FIG. 2) of the ceramic member 10 and an upper surface S3 of the base member 20 face each other in the aforementioned arrangement direction. The electrostatic chuck 100 is an example of a plate-like body in the claims, and the up-down direction is an example of a first direction in the claims.

The ceramic member 10 is a plate-like member having a substantially circular planar upper surface (hereinafter referred to as the "attraction surface") S1 that is substantially orthogonal to the above-described arrangement direction (Z-axis direction) and is formed of ceramic (for example, alumina, aluminum nitride, or the like). The diameter of the ceramic member 10 is, for example, about 50 mm or more and 500 mm or less (usually, about 200 mm or more and 350 mm or less). The thickness of the ceramic member 10 is, for example, about 1 mm or more and 10 mm or less. In the present specification, directions that are orthogonal to the Z-axis direction are referred to as "surface directions". Referring to FIG. 3, among the surface directions, a circumferential direction centered on a center point Px of the attraction surface S1 is referred to as a "circumferential direction CD", and, among the surface directions, a direction orthogonal to the circumferential direction CD is referred to as a "radial direction RD". The attraction surface S1 is an example of a first surface in the claims. The lower surface S2 is an example of a second surface in the claims.

Referring to FIG. 2, a chuck electrode 40 formed of a conductive material (for example, tungsten, molybdenum, platinum, or the like) is disposed in the inner portion of the ceramic member 10. The shape of the chuck electrode 40 as viewed in the up-down direction is, for example, substantially circular. Application of a voltage to the chuck electrode 40 from a power source (not illustrated) generates an electrostatic attraction force, and the wafer W is attracted and fixed to the attraction surface S1 of the ceramic member 10 by the electrostatic attraction force.

In the inner portion of the ceramic member 10, there are also disposed a heater electrode 50 for temperature control of the attraction surface S1 of the ceramic member 10 (that is, temperature control of the wafer W held on the attraction surface S1), and a configuration for supplying power to the heater electrode 50. These configurations will be described later in detail.

The base member 20 is, for example, a circular planar plate-like member having a diameter that is identical to the diameter of the ceramic member 10 or that is larger than the diameter of the ceramic member 10. The base member 20 is formed of, for example, metal (aluminum, aluminum alloy, or the like). The diameter of the base member 20 is, for example, about 220 mm or more and 550 mm or less (usually, about 220 mm or more and 350 mm or less). The thickness of the base member 20 is, for example, about 20 mm or more and 40 mm or less.

The base member 20 is joined to the ceramic member 10 by a joining portion 30 disposed between the lower surface S2 of the ceramic member 10 and the upper surface S3 of the base member 20. The joining portion 30 is constituted by, for example, an adhesive material, such as a silicon resin, an acrylic resin, and an epoxy resin. The thickness of the joining portion 30 is, for example, about 0.1 mm or more and 1 mm or less. The upper surface S3 is an example of a third surface in the claims.

In the inner portion of the base member 20, a refrigerant flow channel 21 is formed. When a refrigerant (for example, a fluorine inert fluid, water, or the like) flows in the refrigerant flow channel 21, the base member 20 is cooled, the ceramic member 10 is cooled by heat transmission (heat dissipation) between the base member 20 and the ceramic member 10 via the joining portion 30, and the wafer W held on the attraction surface S1 of the ceramic member 10 is cooled. Consequently, temperature control of the wafer W is achieved.

A-2. Configurations of Heater Electrode 50 and Others

Next, a configuration of the heater electrode 50 and a configuration for supplying power to the heater electrode 50 will be described in detail.

As described above, the electrostatic chuck 100 includes the heater electrode 50 (refer to FIG. 2). The heater electrode 50 is formed of a conductive material (for example, tungsten, molybdenum, platinum, or the like). In the present embodiment, the heater electrode 50 is disposed on the lower side from the chuck electrode 40.

The heater electrode 50 has a heater line portion 500, which is a resistive heating element that is linear as viewed in the up-down direction. The heater line portion 500 includes a plurality of heater line portions (for example, a later-described first heater line portion 510 and the others illustrated in FIG. 4) that are concentric about the center point Px of the attraction surface S1. Referring to FIG. 3, in the present embodiment, the heater line portion 500 has a shape that is helical about the center point Px as viewed in the up-down direction.

Referring to FIG. 2, the electrostatic chuck 100 has a configuration for supplying power to the heater electrode 50. Specifically, the electrostatic chuck 100 includes a driver electrode 60. In the present embodiment, the driver electrode 60 is disposed on the lower side from the heater electrode 50. The driver electrode 60 is formed of a conductive material (for example, tungsten, molybdenum, platinum, or the like). The driver electrode 60 includes a pair of driver electrodes 61 and 62, which are patterns that have predetermined regions parallel to each other in the surface direction. Each of the driver electrodes 61 and 62 differs from the heater electrode 50 in terms of satisfying the following requirement.

Requirement: the sectional area of each of the driver electrodes 61 and 62 is equal to or more than ten times the sectional area of the heater electrode 50.

An end portion of the heater electrode 50 on one side is electrically connected to the first driver electrode 61 on the one side via a first heater-side via 721 formed of a conductive material. An end portion of the heater electrode 50 on the other side is electrically connected to the driver electrode 62 on the other side via a second heater-side via 722 formed of a conductive material.

Referring to FIG. 2, the electrostatic chuck 100 has a plurality of terminal holes 120 that extend from a lower surface S4 of the base member 20 to the inner portion of the ceramic member 10. FIG. 2 illustrates only a pair of the terminal holes 120, and FIG. 3 illustrates only five terminal holes 120. Each of the terminal holes 120 is an integral hole constituted by a through hole 22, a through hole 32, and a recess portion 12 that are in communication with each other, the through hole 22 passing through the base member 20 in the up-down direction, the through hole 32 passing through the joining portion 30 in the up-down direction, the recess portion 12 being formed on the lower surface S2 side of the ceramic member 10. The through hole 22 formed in the base member 20 is an example of a hole formed in a base member in the claims.

One of the plurality of terminal holes 120 houses a first power supply terminal 741 that has a columnar shape. On the bottom surface of the recess portion 12 of the ceramic member 10 constituting the one of the terminal holes 120, a first electrode pad 731 is provided. The first power supply terminal 741 is joined to the first electrode pad 731 by, for example, brazing or the like. The first electrode pad 731 is electrically connected to the driver electrode 61 on one side via a first power-supply-side via 711. Similarly, another one of the plurality of terminal holes 120 houses a second power supply terminal 742 that has a columnar shape. On the bottom surface of the recess portion 12 of the ceramic member 10 constituting the other one of the terminal holes 120, a second electrode pad 732 is provided. The second power supply terminal 742 is joined to the second electrode pad 732 by, for example, brazing or the like. The second electrode pad 732 is electrically connected to the driver electrode 62 on the other side via a second power-supply-side via 712. The power supply terminals 741 and 742, the electrode pads 731 and 732, and the power-supply-side vias 711 and 712 are all formed of conductive materials.

The pair of power supply terminals 741 and 742 housed in the two terminal holes 120, respectively, are connected to a power source (not illustrated). A voltage from the power source is supplied to the pair of driver electrodes 61 and 62 via the pair of power supply terminals 741 and 742, the pair of electrode pads 731 and 732, and the pair of power-supply-side vias 711 and 712, and applied to the heater electrode 50 via the pair of heater-side vias 721 and 722. Consequently, each electrode 50 generates heat and heats the ceramic member, and thus, temperature control of the attraction surface of the ceramic member (eventually, temperature control of a wafer held on the attraction surface) is achieved. The plurality of terminal holes 120 house, not limited to the heater electrode 50, for example, the chuck electrode 40, the power supply terminals electrically connected to a thermocouple and the like (not illustrated), and the like.

A-3. Specific Portions in Electrostatic Chuck 100:

The electrostatic chuck 100 includes a plurality of specific portions. The plurality of specific portions are disposed in the inner portion of the electrostatic chuck 100 and so as to be side by side in the surface direction as viewed in the up-down direction. Each of the specific portions is a hole that extends in the up-down direction or a conductive portion that extends in the up-down direction. The specific portions restrict the wiring pattern of the heater line portion 500 of the heater electrode 50 because of a physical reason or a reason regarding the temperature distribution of the electrostatic chuck 100. Specifically, examples of the specific portions are presented below.

<Conductive Portion Formed in Inner Portion of Electrostatic Chuck 100>

(1) A first conductive portion (a conductive portion present on the same layer as the heater electrode 50) that is disposed in the inner portion of the ceramic member 10 and present on a virtual plane on which the heater electrode 50 is disposed: when such a first conductive portion is present, the shape of the heater line portion 500 of the heater electrode 50 as viewed in the up-down direction has to be a shape that is curved to avoid the first conductive portion. The first conductive portion is, for example, a via (not illustrated) that electrically connects the chuck electrode 40, the thermocouple (not illustrated), and the like to the terminal holes 120.

(2) A second conductive portion that is disposed in the inner portion of the ceramic member 10 or the base member 20 and that is not present on the aforementioned virtual plane but can be a high-temperature singular point due to current concentration and the like: when such a second conductive portion is present, although the wiring pattern of the heater line portion 500 of the heater electrode 50 is not physically restricted, the high-temperature singular point becomes more remarkable when the heater line portion 500 is disposed so as to overlap the center of the second conductive portion as viewed in the up-down direction. Thus, when such a second conductive portion is present, the shape of the heater line portion 500 of the heater electrode 50 as viewed in the up-down direction is preferably a shape that is curved to avoid at least the center of the second conductive portion. In the present embodiment, the second conductive portion is, for example, terminals, such as the power supply terminals 741 and 742, and the power-supply-side vias 711 and 712.

<Holes Formed in Inner Portion of Electrostatic Chuck 100>

(1) A first hole (a hole present on the same layer as the heater electrode 50) that is present on the virtual plane on which the heater electrode 50 is disposed: when such a first hole is present, the shape of the heater line portion 500 of the heater electrode 50 as viewed in the up-down direction has to be a shape that is curved to avoid the first hole. The first hole is, for example, a lift pin hole (not illustrated) that passes through the electrostatic chuck 100 in the up-down direction or, of the gas flow channel formed in the inner portion of the ceramic member 10, a part (not illustrated) that extends in the up-down direction.

(2) A second hole that is disposed in the inner portion of the ceramic member 10, the base member 20, or the joining portion 30 and that is not present on the aforementioned virtual plane but can be a high-temperature singular point: when such a second hole is present, although the wiring pattern of the heater line portion 500 of the heater electrode 50 is not physically restricted, the high-temperature singular point becomes more remarkable when the heater line portion 500 is disposed so as to overlap the center of the second hole as viewed in the up-down direction. Thus, when such a second hole is present, the shape of the heater line portion 500 of the heater electrode 50 as viewed in the up-down direction is preferably a shape that is curved to avoid at least the center of the second hole. In the present embodiment, the second hole is, for example, the terminal holes 120 (the recess portion 12 and through holes 22 and 32) and the gas flow channel.

A-4. Configuration of Heater Line Portion 500 in Heater Electrode 50

Figure 4:
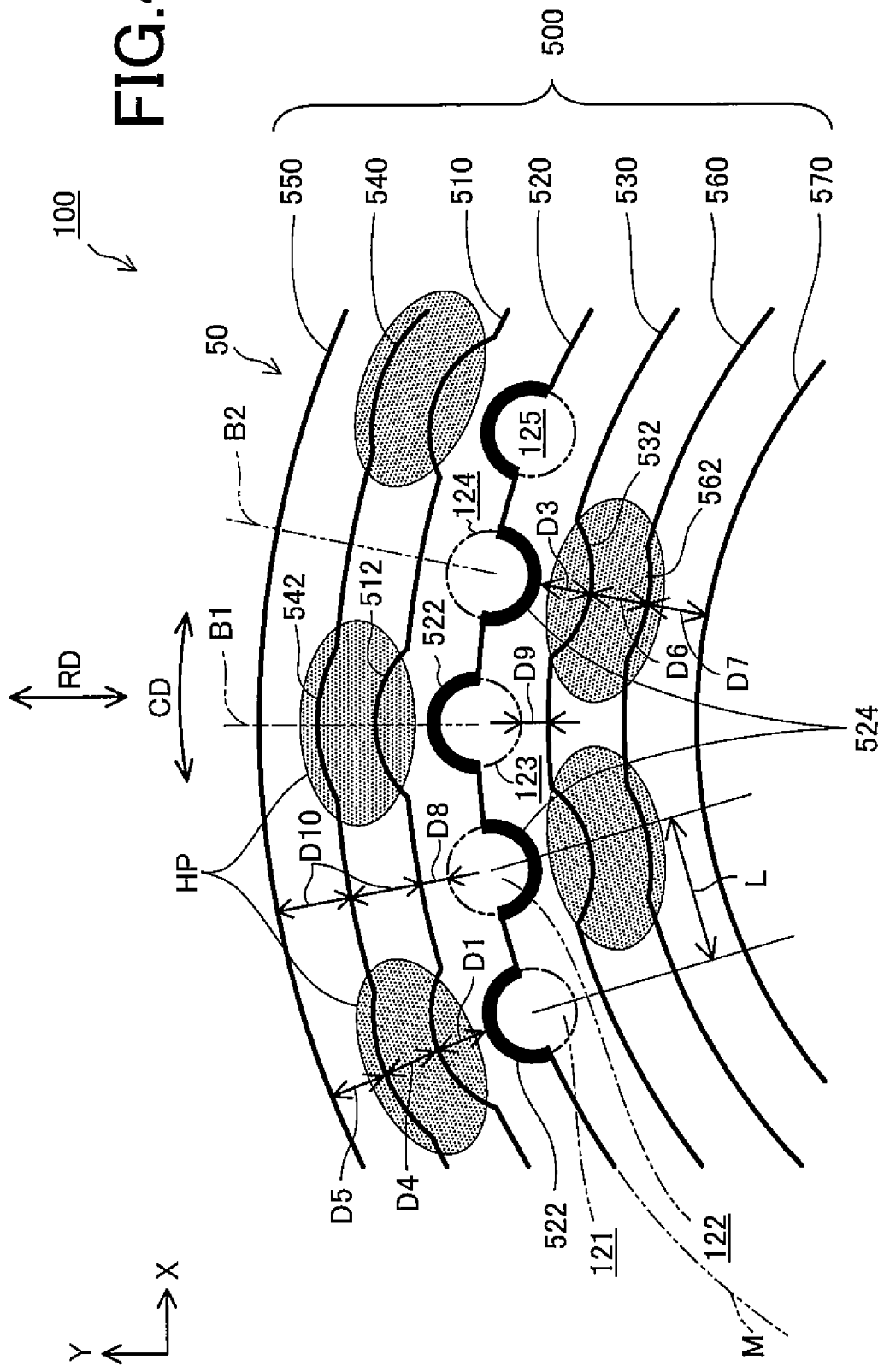
FIG. 4 is an illustration of a wiring pattern of a heater electrode 50 in an X1 part in FIG. 3.

FIG. 4 is an illustration of the wiring pattern of the heater electrode 50 at the X1 part in FIG. 3. FIG. 4 illustrates seven heater line portions 500 (510 to 570) as examples. Referring to FIG. 3 and FIG. 4, five terminal holes 120 (hereinafter referred to as the "a group of the terminal holes 120") are disposed side by side in the circumferential direction CD as viewed in the up-down direction. The distance L between the centers of the terminal holes 120 adjacent to each other in the circumferential direction CD is 60 mm or less and may be 30 mm or less. When the shape of each of the specific portions (the terminal holes 120) as viewed in the up-down direction is non-circle, the center of each specific portion is the center of the circumscribed circle of the shape of the specific portion as viewed in the up-down direction. The circumferential direction CD is an example of an arrangement direction in the claims.

Referring to FIG. 4, the shape of each of the seven heater line portions 500 (510 to 570) as viewed in the up-down direction is a circular arc, as a whole, extending in the circumferential direction CD. The first heater line portion 510 is disposed, as viewed in the up-down direction, on the outer side in the radial direction RD with respect to the group of the terminal holes 120. A third heater line portion 530 is disposed, as viewed in the up-down direction, on the inner side in the radial direction RD with respect to the group of the terminal holes 120. A second heater line portion 520 is disposed in a location closer than the first heater line portion 510 and the third heater line portion 530 to the group of the terminal holes 120. Specifically, at least a portion (a portion extending in the circumferential direction CD) of the second heater line portion 520 is located on a virtual circle M that is centered on the center point Px and that passes through the group of the terminal holes 120.

The shape of the second heater line portion 520 as viewed in the up-down direction is a shape in which a second projecting line part 522 and a second recessed line part 524 are arranged side by side alternately, one by one. The second projecting line part 522 is a portion that curves in a shape that projects toward the same side (the outer side in the radial direction RD) as the first heater line portion 510 with respect to one terminal hole 120. The second recessed line part 524 is a portion that curves in a shape that is recessed toward the same side (the inner side in the radial direction RD) as the third heater line portion 530 with respect to one terminal hole 120. Specifically, a straight line that connects the center of one terminal hole 120 (a first terminal hole 121, a third terminal hole 123, a fifth terminal hole 125) and the first heater line portion 510 to each other by the shortest distance is represented by a first virtual straight line B1. A straight line that connects the center of another terminal hole 120 (a second terminal hole 122, a fourth terminal hole 124) adjacent to the aforementioned one terminal hole 120 and the first heater line portion 510 to each other by the shortest distance is represented by a second virtual straight line B2. The second projecting line part 522 is a portion that passes through the first virtual straight line B1 and that curves in a shape that projects toward the side of the first heater line portion 510. The second recessed line part 524 is a portion that extends to avoid the second virtual straight line B2 and that curves in a shape that is recessed toward a side opposite to the side of the first heater line portion 510. The first terminal hole 121, the third terminal hole 123, and the fifth terminal hole 125 correspond to a first specific portion and a third specific portion in the claims. The second terminal hole 122 and the fourth terminal hole 124 correspond to a second specific portion in the claims. The first virtual straight line B1 is an example of a first virtual straight line and a third virtual straight line in the claims.

In the present embodiment, the second projecting line part 522 and the second recessed line part 524 are each disposed to be along the circular arc of the terminal hole 120 as viewed in the up-down direction. The width of each of the second projecting line part 522 and the second recessed line part 524 is wider than the width of each of the other portions (portions extending in the circumferential direction CD) in the heater line portion 500. Thus, the sectional area of each of the second projecting line part 522 and the second recessed line part 524 is larger than the sectional area of each of the other portions in the heater line portion 500. As a result, a temperature rise due to heat generation in the second projecting line part 522 and the second recessed line part 524 is suppressed. The second projecting line part 522 is an example of a projecting line part in the claims. The second recessed line part 524 is an example of a recessed line part in the claims.

The shape of the first heater line portion 510 as viewed in the up-down direction is a shape including a first projecting line part 512 that curves in a shape that projects outward in the radial direction RD by corresponding to the second projecting line part 522 of the second heater line portion 520. A fourth heater line portion 540 is disposed on the outer side in the radial direction RD with respect to the first heater line portion 510. The shape of the fourth heater line portion 540 as viewed in the up-down direction is a shape that is substantially identical to the shape of the first heater line portion 510 and that includes a fourth projecting line part 542 that curves in a shape that projects outward in the radial direction RD by corresponding to the second projecting line part 522. Each of the first projecting line part 512 and the fourth projecting line part 542 has a small projecting degree and has a gentle curve compared with the second projecting line part 522.

A fifth heater line portion 550 is disposed on the outer side in the radial direction RD with respect to the fourth heater line portion 540. The shape of the fifth heater line portion 550 as viewed in the up-down direction is a circular arc extending in the circumferential direction CD over the whole length. A shortest distance D1 (a distance in the radial direction RD) between the second projecting line part 522 and the first projecting line part 512, a shortest distance D4 between the first projecting line part 512 and the fourth projecting line part 542, and a shortest distance D5 between the fourth projecting line part 542 and the fifth heater line portion 550 are substantially identical to each other. Each of these shortest distances D1, D4, and D5 is shorter than a shortest distance D10 between parts that extend in the radial direction RD in two heater line portions 500 adjacent to each other in the radial direction RD. Therefore, referring to FIG. 4, the heater line portions 500 are present relatively densely in the vicinity of the second projecting line part 522, and thus the vicinity easily becomes a high-temperature singular point HP.

The shape of the third heater line portion 530 as viewed in the up-down direction is a shape that includes a third recessed line part 532 that curves in a shape that is recessed inward in the radial direction RD by corresponding to the second recessed line part 524 of the second heater line portion 520. A sixth heater line portion 560 is disposed on the inner side in the radial direction RD with respect to the third heater line portion 530. The shape of the sixth heater line portion 560 as viewed in the up-down direction is a shape that is substantially identical to the shape of the third heater line portion 530 and that includes a sixth recessed line part 562 that curves in a shape that is recessed inward in the radial direction RD by corresponding to the second recessed line part 524.

Each of the third recessed line part 532 and the sixth recessed line part 562 has a small projecting degree and has a gentle curve compared with the second recessed line part 524. A seventh heater line portion 570 is disposed on the outer side in the radial direction RD with respect to the sixth heater line portion 560. The shape of the seventh heater line portion 570 as viewed in the up-down direction is a circular arc extending in the circumferential direction CD over the whole length. A shortest distance D3 between the second recessed line part 524 and the third recessed line part 532, a shortest distance D6 between the third recessed line part 532 and the sixth recessed line part 562, and a shortest distance D7 between the sixth recessed line part 562 and the seventh heater line portion 570 are substantially identical to each other. Each of these shortest distances D3, D6, and D7 is shorter than the aforementioned shortest distance D10 between the parts extending in the radial direction RD in two heater line portions 500 (510 to 570) adjacent to each other in the radial direction RD. Therefore, referring to FIG. 4, the heater line portions 500 are present relatively densely in the vicinity of the second recessed line part 524, and thus, the vicinity easily becomes the high-temperature singular point HP.

A shortest distance D8 between the first heater line portion 510 and the terminal hole 120 (122, 124) corresponding to the second recessed line part 524 is shorter than the shortest distance D1 between the first heater line portion 510 and the terminal hole 120 (121, 123, 125) corresponding to the second projecting line part 522. A shortest distance D9 between the third heater line portion 530 and the terminal hole 120 (121, 123, 125) corresponding to the second projecting line part 522 is shorter than the shortest distance D3 between the third heater line portion 530 and the terminal hole 120 (122, 124) corresponding to the second recessed line part 524.

A-5. Effects of Present Embodiment

As described above, in the electrostatic chuck 100 according to the present embodiment, the heater line portion 500 of the heater electrode 50 includes the first heater line portion 510 and the second heater line portion 520, and the first heater line portion 510 and the second heater line portion 520 each extend substantially in the arrangement direction of the plurality of terminal holes 120 (specific portions). The second heater line portion 520 is disposed in a location closer than the first heater line portion 510 to the plurality of terminal holes 120 and includes the second projecting line part 522 and the second recessed line part 524 that curve by corresponding to, for example, the third terminal hole 123 and the second terminal hole 122. That is, the second projecting line part 522 curves, as viewed in the up-down direction, in a shape that projects toward the same side as the first heater line portion 510 with respect to the third terminal hole 123. In contrast, the second recessed line part 524 curves, as viewed in the up-down direction, in a shape that is recessed toward the side opposite to the side of the first heater line portion 510 with respect to the second terminal hole 122. Thus, for example, compared with a configuration in which the heater line portion 500 of the heater electrode 50 curves in a shape that projects on the same side with respect to both the second terminal hole 122 and the third terminal hole 123 adjacent to each other, it is possible to suppress a high-temperature region MP (refer to FIG. 5) from being generated as a result of the high-temperature singular points HP being present densely due to dense presence of the heater line portions 500 around the plurality of terminal holes 120 as viewed in the up-down direction.

Next, specific description will be provided.

Figure 5:
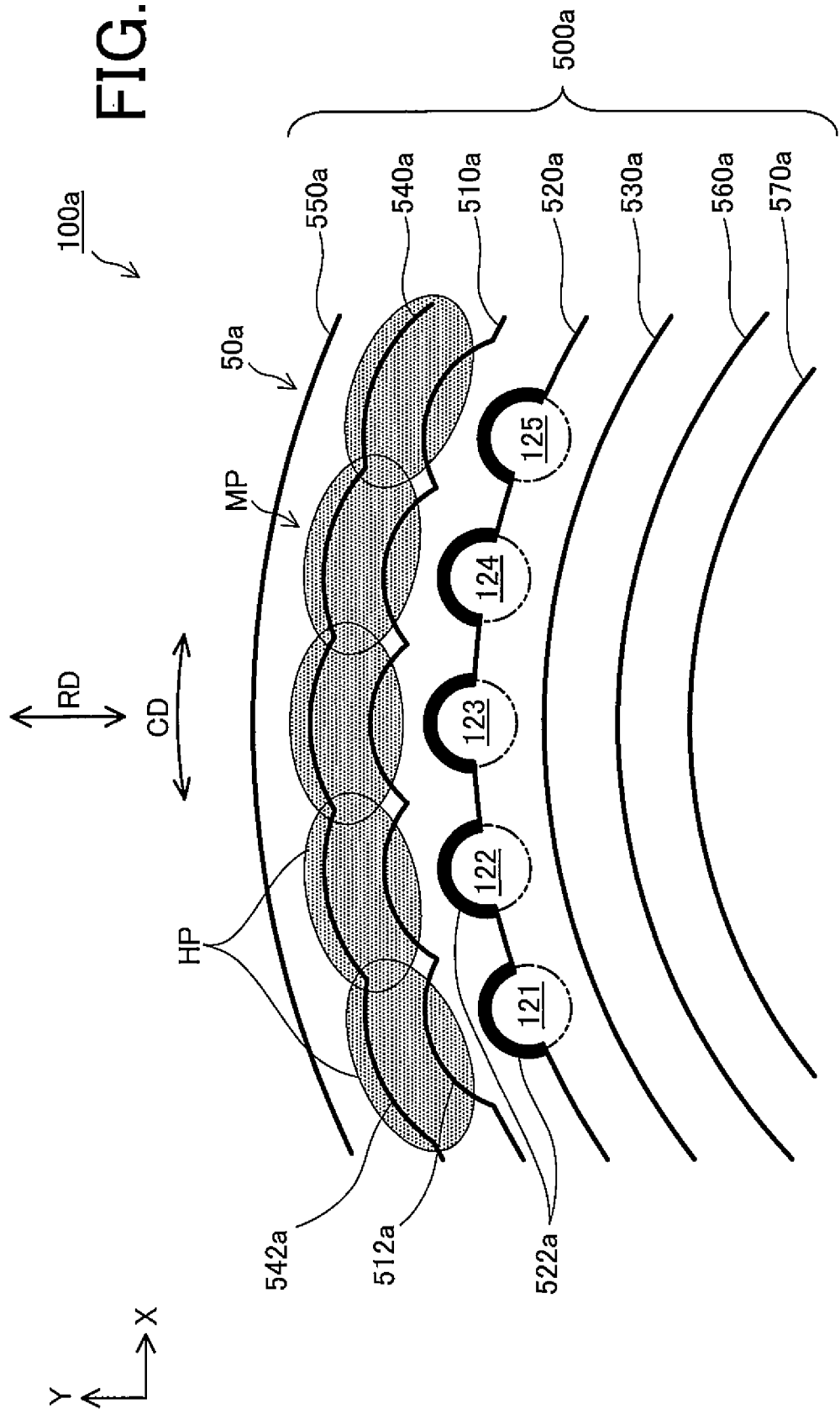
FIG. 5 is an illustration of a wiring pattern of a heater electrode 50a in an electrostatic chuck 100a of a comparative example.

FIG. 5 is an illustration of a wiring pattern of a heater electrode 50a in an electrostatic chuck 100a of a comparative example. Referring to FIG. 5, also in the comparative example, a heater line portion 500a of the heater electrode 50a has a shape that curves to avoid the centers of the plurality of terminal holes 120 (121 to 125). Thus, according to the comparative example, compared with a configuration in which a heater line portion is formed so as to overlap the centers of the terminal holes 120 having a low heat dissipation effect in the base member 20, it is possible to suppress a high-temperature singular point from being generated due to the presence of the terminal holes 120 (specific portions).

However, the comparative example has a problem that the high-temperature region MP is easily generated in the vicinity of the plurality of terminal holes 120. That is, in the comparative example, the heater line portion 500a of the heater electrode 50a has a configuration of curving in a shape that projects toward the same side with respect to all of the plurality of terminal holes 120 (510 to 570). Specifically, a second heater line portion 520a includes a plurality of second projecting line parts 522a but does not include a portion that corresponds to the second recessed line part 524 of the aforementioned embodiment. In short, the heater line portion 500a has a shape that curves outward in the radial direction RD with respect to the plurality of terminal holes 120 over the entirety thereof to avoid the centers of the plurality of terminal holes 120. Thus, a plurality of the high-temperature singular points HP due to the dense presence of the heater line portions 500a concentrate on the outer side of the second heater line portion 520a in the radial direction RD. As a result, the high-temperature region MP is generated in the vicinity of the plurality of terminal holes 120.

In contrast, referring to FIG. 4, in the present embodiment, the shape of the second heater line portion 520 as viewed in the up-down direction is a shape in which the second projecting line part 522 and the second recessed line part 524 are arranged side by side alternately. Thus, according to the present embodiment, compared with the comparative example, a plurality of the high-temperature singular points HP due to the dense presence of the heater line portions 500a are dispersed. Therefore, it is possible to suppress the high-temperature region MP from being generated in the vicinity of the plurality of terminal holes 120.

In the present embodiment, the distance L between the centers of the terminal holes 120 adjacent to each other in the circumferential direction CD is 60 mm or less. In such a configuration, the specific portions are densely present, and it is thus effective, in particular, to employ the present invention. FIG. 6 is an illustration of a relationship between the distance L between the centers of the specific portions (terminal holes 120) and a relative temperature ΔT (° C.) in the vicinity of the specific portions. The relative temperature is a temperature obtained by subtracting a predetermined basic temperature from a measured temperature. Regarding the electrostatic chuck 100 of the aforementioned embodiment, a first graph G1 indicates, for each of a plurality of samples that differ from each other in terms of distance L between the centers of the terminal holes 120, a relative temperature in the vicinity of the terminal holes 120 during heat generation of the heater electrode 50. Regarding the electrostatic chuck 100a of the aforementioned comparative example, a second graph G2 indicates, for each of a plurality of samples that differ from each other in terms of distance L between the centers of the terminal holes 120, a relative temperature in the vicinity of the terminal holes 120 during heat generation of the heater electrode 50a.

According to FIG. 6, it is understood that, according to the present embodiment, generation of the high-temperature region is suppressed compared with the comparative example, and a temperature rise in the vicinity of the specific portions can be suppressed. In addition, the difference between the embodiment and the comparative example is remarkable when the distance L between the centers of the terminal holes 120 is 30 mm or less, 20 mm or less, and further, 10 mm or less. Thus, it is understood that it is effective, in particular, to employ the present invention in a configuration in which the distance L between the centers of the terminal holes 120 is 30 mm or less, a configuration in which the distance L is 20 mm or less, and further, a configuration in which the distance L is 10 mm or less.

In the present embodiment, the shape of the second heater line portion 520 as viewed in the up-down direction is the shape in which the second projecting line part 522 and the second recessed line part 524 are arranged side by side alternately. Consequently, compared with a configuration in which the second projecting line part 522 and the second recessed line part 524 in the second heater line portion 520 are arranged side by side irregularly, it is possible to effectively suppress the high-temperature region MP from being generated due to dense presence of the heater line portions 500 around the plurality of specific portions as viewed in the up-down direction.

In the present embodiment, the shortest distance D8 between the first heater line portion 510 and the terminal hole 120 (122, 124) corresponding to the second recessed line part 524 is shorter than the shortest distance D1 between the first heater line portion 510 and the terminal hole 120 (121, 123, 125) corresponding to the second projecting line part 522. Consequently, according to the present embodiment, regarding the first heater line portion 510, while suppressing an unnecessary shape change in the vicinity of the terminal hole 120 (122, 124) corresponding to the second recessed line part 524, it is possible to suppress a high-temperature singular point from being generated due to dense presence of the heater line portions 500 around the terminal hole 120 (121, 123, 125) corresponding to the second projecting line part 522.

In the present embodiment, the shortest distance D9 between the third heater line portion 530 and the terminal hole 120 (121, 123, 125) corresponding to the second projecting line part 522 is shorter than the shortest distance D3 between the third heater line portion 530 and the terminal hole 120 (122, 124) corresponding to the second recessed line part 524. Consequently, according to the present embodiment, regarding the third heater line portion 530, while suppressing an unnecessary shape change in the vicinity of the terminal hole 120 (121, 123, 125) corresponding to the second projecting line part 522, it is possible to suppress a high-temperature singular point from being generated due to dense presence of the heater line portions 500 around the terminal hole 120 as viewed in the up-down direction.

According to the present embodiment, while suppressing a suction effect of the base member 20 from varying due to the holes (terminal holes 120) formed in the base member 20, it is possible to suppress a high-temperature region from being generated due to dense presence of the heater line portions 500 around the plurality of specific portions (terminal holes 120) as viewed in the up-down direction.

B. Modifications

The technology disclosed in the present specification is not limited to the above-described embodiment and can be modified into various forms within a range not deviating from the gist thereof. For example, following modifications are available.

The configuration of the electrostatic chuck 100 in the aforementioned embodiment is merely an example and can be variously modified. The electrostatic chuck 100 may have a configuration that includes a plurality of heater electrodes disposed on one virtual plane that is substantially perpendicular to the first direction.

Moreover, the electrostatic chuck 100 may have a configuration that includes a heater electrode on each of a plurality of layers the positions of which in the up-down direction differ from each other. Specifically, in the present embodiment, a configuration in which another heater electrode (for example, a plurality of heater electrodes disposed on one virtual plane that is substantially perpendicular to the first direction) is disposed on the heater electrode 50 may be employed. In such a configuration, the wiring pattern of the heater electrode 50 is restricted by a plurality of conductive portions (vias and the like) for electrically connecting each of the plurality of heater electrodes to a power supply terminal disposed on the lower surface S2 side of the ceramic member 10. The plurality of conductive portions correspond to the specific portions in the claims. Thus, it is effective, in particular, to employ the present invention in such a configuration. In addition, the shape of the heater electrode 50 is not limited to the helical shape and may be an annular shape, a circular arc shape, a linear shape, and the like.

In the aforementioned embodiment, the first heater line portion 510 to the seventh heater line portion 570 are parts of the heater line portion 500 included in one heater electrode 50 but may be heater line portions of the heater electrodes that differ from each other. In addition, the shape of the second heater line portion 520 as viewed in the up-down direction may be a shape that includes the second projecting line part 522 and the second recessed line part 524, one each, or may be a shape in which a plurality of the second projecting line parts 522 and a plurality of the second recessed line parts 524 are alternately arranged side by side.

In addition, the shape of each of the projecting line parts (the second projecting line part 522 and the like) and the recessed line parts (the second recessed line part 524 and the like) in the heater line portion 500 as viewed in the up-down direction is not limited to a curved shape and may be a folded line shape and the like.

In the aforementioned embodiment, the number of the through holes 22 formed in the base member 20 is five but is not limited thereto. The number of the through holes 22 may be other than five.

In the aforementioned embodiment, the direction in which the plurality of specific portions (terminal holes 120) are arranged side by side is the circumferential direction CD but may be, for example, a linear direction. In addition, in the aforementioned embodiment, each of the second projecting line part 522 and the second recessed line part 524 is disposed so as to be along the circular arc of the terminal hole 120 as viewed in the up-down direction but may be disposed such that at least a portion of the second projecting line part 522 or the second recessed line part 524 overlaps the terminal hole 120, or may be disposed on the outer side of the terminal hole 120. In addition, the width of each of the second projecting line part 522 and the second recessed line part 524 may be substantially identical to the width of each of the other portions in the heater line portion 500.

In the present embodiment, the shortest distance D8 between the first heater line portion 510 and the terminal hole 120 (122, 124) corresponding to the second recessed line part 524 may be identical to the shortest distance D1 between the first heater line portion 510 and the terminal hole 120 (121, 123, 125) corresponding to the second projecting line part 522 or may be longer than the shortest distance D1. In addition, in the present embodiment, the shortest distance D9 between the third heater line portion 530 and the terminal hole 120 (121, 123, 125) corresponding to the second projecting line part 522 may be identical to the shortest distance D3 between the third heater line portion 530 and the terminal hole 120 (122, 124) corresponding to the second recessed line part 524 or may be longer than the shortest distance D3.

In addition, in the aforementioned embodiment, each via may be constituted by a single via or may be constituted by a group of a plurality of vias. In addition, in the aforementioned embodiment, each via may have a single-layer configuration constituted by only a via part, or may have a multilayer configuration (for example, a configuration in which a via part, a pad part, and a via part are layered on each other).

In addition, in the aforementioned embodiment, although a unipolar form in which one chuck electrode 40 is provided in the inner portion of the ceramic member 10 is employed, a bipolar form in which a pair of the chuck electrodes 40 are provided in the inner portion of the ceramic member 10 may be employed. In addition, the materials that form members in the electrostatic chuck 100 of the aforementioned embodiment are merely presented as examples. The members may be formed of the other materials.

In the aforementioned embodiment, the electrostatic chuck 100 that includes, as plate-like members, the ceramic member 10, the base member 20, and the joining portion 30 is presented as example but may be a ceramic-member single body, a heating device including a ceramic member and a support member, and the like. In addition, the plate-like members may be members that are formed of a material (for example, metal or resin) other than ceramics.

In the aforementioned embodiment, although the base member 20 made of metal is presented as an example of the base member, the other base members can be employed as long as being formed of a material having thermal conductivity that is higher than the thermal conductivity of the ceramic member.

In addition, the present invention is applicable, not limited to the electrostatic chuck 100 that includes the ceramic member 10 and the base member 20 and that holds the wafer W by utilizing an electrostatic attraction force, to an object (for example, a heater device of a CVD heater and the like, a heating device (a holding device, a part for a semiconductor manufacturing apparatus) of a vacuum chuck and the like)) that includes a plate-like member provided with a heater electrode.

What is claimed is:

1. A heating device comprising:
   a plate-like body having a first surface substantially perpendicular to a first direction;
   a resistive heater disposed in an inner portion of the plate-like body, the resistive heater including a heater line portion that is a resistive heating element that is continuous as viewed in the first direction; and
   a plurality of specific portions disposed in the inner portion of the plate-like body and, as viewed in the first direction, arranged side by side in a circumferential direction, each of the plurality of specific portions being a hole or a conductive portion extending in the first direction, the heating device being configured to allow an object to be disposed on the first surface of the plate-like body,
   wherein, as viewed in the first direction, the heater line portion of the resistive heater includes
      a first heater line portion extending in the circumferential direction, and
      a second heater line portion extending in the circumferential direction and disposed in a location closer than the first heater line portion to the plurality of specific portions, and
   wherein, a first virtual straight line segment is defined by a straight line that connects by a shortest distance a center of a first specific portion among the plurality of specific portions and the first heater line portion, and a second virtual straight line segment is defined by a straight line that connects by a shortest distance a center of a second specific portion among the plurality of specific portions adjacent to the first specific portion and the first heater line portion,
   wherein, as viewed in the first direction, the second heater line portion includes
      a projecting line part that passes through the first virtual straight line and that curves in a shape that projects toward the first heater line portion, and
      a recessed line part that extends to avoid the second virtual straight line and that curves in a shape that is recessed away from the first heater line portion.

2. The heating device according to claim 1,
   wherein a distance between the center of the first specific portion and the center of the second specific portion is 60 mm or less.

3. The heating device according to claim 1,
   wherein the plurality of specific portions include a third specific portion adjacent to the second specific portion opposite from the first specific portion,
   wherein, a third virtual straight line is defined by a straight line that connects by a shortest distance the third specific portion and the first heater line portion, and
   the second heater line portion further includes a second projecting line part that passes through the third virtual straight line and that curves in a shape that projects toward the first heater line portion.

4. The heating device according to claim 3,
wherein the distance between the center of the first specific portion and the center of the second specific portion and a distance between the center of the second specific portion and a center of the third specific portion are each 60 mm or less.

5. The heating device according to claim 1,
wherein a shortest distance between the first heater line portion and the specific portion corresponding to the recessed line part of the second heater line portion is shorter than a shortest distance between the first heater line portion and the specific portion corresponding to the projecting line part of the second heater line portion.

6. The heating device according to claim 1,
wherein the heater line portion of the resistive heater further includes a third heater line portion extending in the circumferential direction and, as viewed in the first direction, disposed opposite to the first heater line portion with respect to the second heater line portion, and
wherein a shortest distance between the third heater line portion and the specific portion corresponding to the projecting line part of the second heater line portion is shorter than a shortest distance between the third heater line portion and the specific portion corresponding to the recessed line part of the second heater line portion.

7. The heating device according to claim 1,
wherein the plate-like body includes
a ceramic member having the first surface and a second surface opposite to the first surface,
a base member having a third surface and arranged such that the third surface faces the second surface of the ceramic member, the base member being formed of a material having thermal conductivity higher than thermal conductivity of the ceramic member, and
a joining portion that is disposed between the second surface of the ceramic member and the third surface of the base member and that joins the ceramic member and the base member to each other, and
wherein at least one of the plurality of specific portions is a hole defined in the base member.

8. The heating device according to claim 1,
wherein the heating device is an electrostatic chuck.

* * * * *